(12) United States Patent
Lee et al.

(10) Patent No.: US 10,854,645 B2
(45) Date of Patent: Dec. 1, 2020

(54) METHOD FOR FABRICATING THIN FILM TRANSISTOR SUBSTRATE

(71) Applicant: SAMSUNG DISPLAY CO., LTD., Yongin-si (KR)

(72) Inventors: Jun Hee Lee, Yongin-si (KR); Sung Hoon Moon, Yongin-si (KR); Dong Hyun Son, Yongin-si (KR); Pil Soo Ahn, Yongin-si (KR); Kohei Ebisuno, Yongin-si (KR); Sang Hoon Oh, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/273,374

(22) Filed: Feb. 12, 2019

(65) Prior Publication Data
US 2019/0252420 A1   Aug. 15, 2019

(30) Foreign Application Priority Data
Feb. 13, 2018   (KR) .................. 10-2018-0017763

(51) Int. Cl.
*H01L 27/12*  (2006.01)
*H01L 27/32*  (2006.01)
*H01L 29/786* (2006.01)
*H01L 51/00*  (2006.01)
*H01L 51/56*  (2006.01)

(52) U.S. Cl.
CPC ...... *H01L 27/1262* (2013.01); *H01L 27/3246* (2013.01); *H01L 29/78603* (2013.01); *H01L 51/0097* (2013.01); *H01L 27/3244* (2013.01); *H01L 51/56* (2013.01); *H01L 2227/323* (2013.01); *H01L 2251/5338* (2013.01)

(58) Field of Classification Search
None
See application file for complete search history.

(56) References Cited

U.S. PATENT DOCUMENTS

| | | | |
|---|---|---|---|
| 9,306,071 B2 | 4/2016 | Lee et al. | |
| 2012/0205647 A1* | 8/2012 | Heo | H01L 27/3262 257/43 |
| 2017/0283673 A1 | 10/2017 | Zhou et al. | |
| 2020/0066691 A1* | 2/2020 | Chae | H01L 33/38 |

FOREIGN PATENT DOCUMENTS

KR   10-2014-0097940 A   8/2014

* cited by examiner

*Primary Examiner* — Asok K Sarkar
(74) *Attorney, Agent, or Firm* — Kile Park Reed & Houtteman PLLC (57) ABSTRACT

A method for fabricating a thin film transistor substrate includes forming a buffer layer including at least one film on a base substrate, planarizing a surface of the buffer layer, and forming a thin film transistor on the buffer layer.

18 Claims, 5 Drawing Sheets

METHOD FOR FABRICATING THIN FILM TRANSISTOR SUBSTRATE

CROSS-REFERENCE TO RELATED APPLICATION

Korean Patent Application No. 10-2018-0017763, filed on Feb. 13, 2018, in the Korean Intellectual Property Office, and entitled: "Method for Fabricating Thin Film Transistor Substrate," is incorporated by reference herein in its entirety.

BACKGROUND

1. Field

Embodiments relate to a method for fabricating a thin film transistor substrate.

2. Description of the Related Art

An organic light-emitting display device is a self-emitting type display device which includes a hole injection electrode, an electron injection electrode, and an organic light emitting layer formed between the hole injection electrode and the electron injection electrode, and emits light as holes injected from the hole injection electrode and electrons injected from the electron injection electrode recombine in the organic light emitting layer and disappear. The organic light-emitting display device is getting attention as a next generation display device, since it exhibits high quality characteristics such as low power consumption, high luminance and high reaction speed.

The organic light-emitting display device includes thin film transistors for controlling the operation of each pixel or transmitting an electric signal supplied from a driving unit to each pixel.

SUMMARY

Embodiments are directed to a method for fabricating a thin film transistor substrate, including forming a buffer layer including at least one film on a base substrate, planarizing a surface of the buffer layer, and forming a thin film transistor on the buffer layer.

Planarizing the surface of the buffer layer may be performed by chemical mechanical polishing/planarization (CMP).

The buffer layer may include a first buffer layer provided on the base substrate, and a second buffer layer provided on the first buffer layer.

The method may further include planarizing a surface of the first buffer layer.

The first buffer layer may include silicon oxide. The second buffer layer may include silicon nitride.

The buffer layer may further include a third buffer layer provided on the second buffer layer.

The method may further include planarizing a surface of the second buffer layer.

The third buffer layer may include silicon oxide.

The thin film transistor may include a semiconductor layer on the buffer layer, a gate electrode overlapping the semiconductor layer with a gate insulating film interposed therebetween, and a source electrode and a drain electrode connected to the semiconductor layer and spaced apart from the each other.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 1:
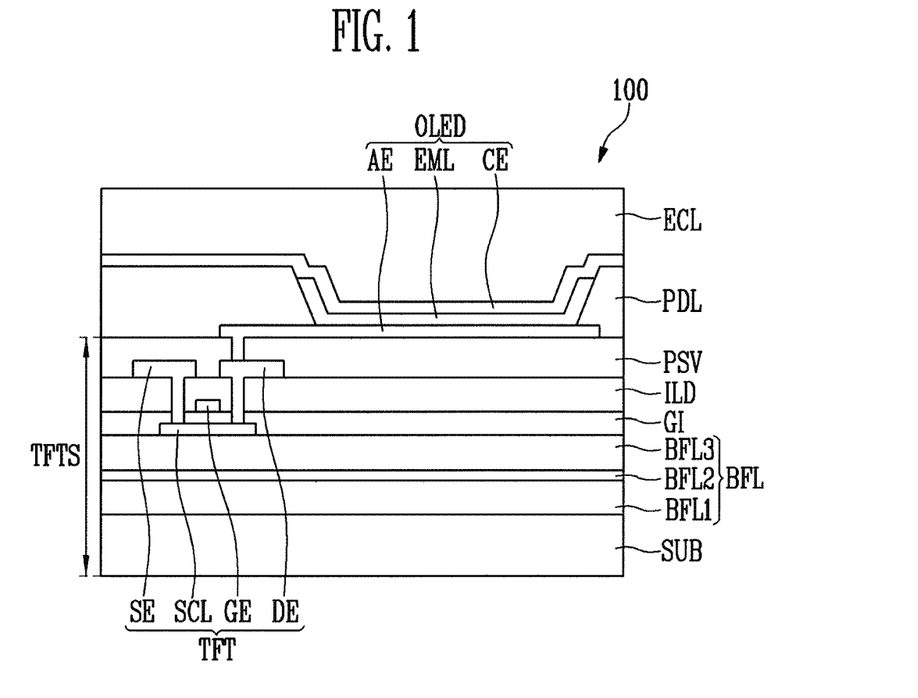
FIG. 1 illustrates a cross-sectional view of a display device including a thin film transistor substrate according to an embodiment.

FIG. 1 illustrates a cross-sectional view of a display device 100 including a thin film transistor substrate according to an embodiment.

Referring to FIG. 1, the display device 100 may include a thin film transistor substrate TFTS and a display element OLED provided on the thin film transistor substrate TFTS.

The thin film transistor substrate TFTS may include a base substrate SUB, a buffer layer BFL on the base substrate SUB, and at least one the thin film transistor TFT provided on the buffer layer BFL.

The base substrate SUB may include a transparent insulating material to transmit light.

The base substrate SUB may be a flexible substrate. The flexible substrate may include a film substrate including a polymeric organic material and a plastic substrate. For example, the flexible substrate may be made of a material selected from polyethersulfone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), triacetate cellulose (TAC) and cellulose acetate propionate (CAP). In some implementations, the flexible substrate may include fiber glass reinforced plastics (FRP).

The base substrate SUB may be a rigid substrate. The rigid substrate may be one of a glass substrate, a quartz substrate, a glass ceramic substrate and a crystalline glass substrate.

The material to be applied to the base substrate SUB may have resistance against a high processing temperature (or heat resistance) in the manufacturing process of the display device.

The buffer layer BFL may be disposed between the base substrate SUB and the thin film transistor TFT. The buffer layer BFL may include an inorganic insulating material. For example, the buffer layer BFL may include at least one of silicon oxide ($SiO_x$), silicon nitride ($SiN_x$) and silicon oxynitride (SiON).

The buffer layer BFL may have a single-film structure or a multi-film structure. For example, the buffer layer BFL may have a single-film structure including one of silicon oxide, silicon nitride and silicon oxynitride. The buffer layer BFL may include a silicon oxide film, and a silicon nitride film provided on the silicon oxide film. The buffer layer BFL may include three or more insulating films that are stacked sequentially.

FIG. 1 illustrates an example of a buffer layer BFL having a triple-film structure including a first buffer layer BFL1, a second buffer layer BFL2 and a third buffer layer BFL3 in order from the base substrate SUB. The first buffer layer BFL1 may be a silicon oxide film, the second buffer layer BFL2 may be a silicon nitride film, and the third buffer layer BFL3 may be a silicon oxide film, as examples.

The buffer layer BFL may prevent impurities from diffusing from the base substrate SUB to the thin film transistor TFT. The buffer layer BFL may also planarize the surface of the base substrate SUB.

The thin film transistor TFT may be connected to a gate line and a data line. The thin film transistor TFT may include a semiconductor layer SCL, a gate electrode GE, a source electrode SE and a drain electrode DE.

The semiconductor layer SCL may be provided on the buffer layer BFL. The semiconductor layer SCL may include one of amorphous Si, polycrystalline Si, an oxide semiconductor and an organic semiconductor. In the semiconductor layer SCL, regions connected to the source electrode SE and the drain electrode DE may be a source region and a drain region, respectively, which are doped or injected with impurities. A region between the source region and the drain region may be a channel region.

When the semiconductor layer SCL includes an oxide semiconductor, a light blocking film may be provided for blocking light entering from the upper portion or the lower portion of the semiconductor layer SCL to the semiconductor layer SCL.

A gate insulating film GI may be provided on the semiconductor layer SCL. The gate insulating film GI may cover the semiconductor layer SCL and insulate the semiconductor layer SCL and the gate electrode GE. The gate insulating film GI may include at least one of an organic insulating material and an inorganic insulating material. For example, the gate insulating film GI may include at least one of silicon oxide and silicon nitride.

The gate electrode GE may be provided on the gate insulating film GI. The gate electrode GE may be connected to the gate line. The gate electrode GE may include a low-resistance conductive material and may overlap the semiconductor layer SCL.

An interlayer insulating film ILD may be provided on the gate electrode GE. The interlayer insulating film ILD may include at least one of an organic insulating material and an inorganic insulating material. For example, the interlayer insulating film ILD may include at least one of silicon oxide and silicon nitride. The interlayer insulating film ILD may insulate the source electrode SE, the drain electrode DE and the gate electrode GE from each other.

Contact holes passing through the gate insulating film GI and the interlayer insulating film ILD may expose the source region and the drain region of the semiconductor layer SCL.

The source electrode SE and the drain electrode DE may be disposed apart from each other on the interlayer insulating film ILD. The source electrode SE and the drain electrode DE may include a low-resistance conductive material. One end of the source electrode SE may be connected to the data line. The other end of the source electrode SE may be connected to the source region through one of the contact holes. One end of the drain electrode DE may be connected to the drain region through the other one of the contact holes. The other end of the drain electrode DE may be connected to a display element LED.

The case where the thin film transistor TFT is a thin film transistor having a top gate structure is described as an example. In some implementations, the thin film transistor TFT may be a thin film transistor having a bottom gate structure.

The thin film transistor substrate TFTS may further include a passivation film PSV provided on the thin film transistor TFT. The passivation film PSV may cover the thin film transistor TFT. A portion of the passivation film PSV may be removed to expose one of the source electrode SE and the drain electrode DE, for example, the drain electrode DE.

The passivation film PSV may include at least one film. For example, the passivation film PSV may include an inorganic passivation film and an organic passivation film provided on the inorganic passivation film. The inorganic passivation film may include at least one of silicon oxide and silicon nitride. The organic passivation film may include one of acryl, polyimide (PI), polyamide (PA) and benzocyclobutene (BCB). The organic passivation film may be a planarizing film that is transparent and has fluidity to flatten the unevenness of the underlying structure.

The display element OLED may be provided on the passivation film PSV. The display device OLED may be an organic light emitting device. The display element OLED may include a first electrode AE connected to the thin film transistor TFT, a light emitting layer EML provided on the first electrode AE, and a second electrode CE provided on the light emitting layer EML. One of the first electrode AE and the second electrode CE may be an anode electrode and the other electrode may be a cathode electrode. For example, the first electrode AE may be an anode electrode, and the second electrode CE may be a cathode electrode.

In addition, at least one of the first electrode AE and the second electrode CE may be a transmissive electrode. For example, when the display element OLED is a bottom emission type organic light emitting element, the first electrode AE may be a transmissive electrode, and the second electrode CE may be a reflective electrode. When the display element OLED is a top emission type organic light emitting element, the first electrode AE may be a reflective electrode and the second electrode CE may be a transmissive electrode. When the display element OLED is a double-sided emission type organic light emitting element, both of the first electrode AE and the second electrode CE may be transmissive electrodes. Herein, the case where the display element OLED is the top emission type organic light emitting element and the first electrode AE is the anode electrode will be described as an example.

In each pixel, the first electrode AE may be provided on the passivation film PSV. The first electrode AE may include a transparent conductive film capable of transmitting light, and a reflective film capable of reflecting light. The reflective film may be provided on the top or bottom of the transparent conductive film. At least one of the transparent conductive film and the reflective film may be connected to the drain electrode DE.

The transparent conductive film may include a transparent conductive oxide. For example, the transparent conductive film may be made of indium tin oxide (ITO), indium zinc oxide (IZO), aluminum zinc oxide (AZO), gallium doped zinc oxide (GZO), zinc tin oxide (ZTO), gallium tin oxide (GTO) or fluorine doped tin oxide (FTO).

The reflective film may include a material capable of reflecting light. For example, the reflective film may include at least one of aluminum (Al), silver (Ag), chromium (Cr), molybdenum (Mo), platinum (Pt), nickel (Ni) and alloys thereof.

A pixel defining layer PDL may be provided on the first electrode AE. The pixel defining layer PDL may be provided between the pixel regions. The pixel defining layer PDL may expose the first electrode AE. The pixel defining layer PDL may overlap the edge portion of the first electrode AE. The pixel defining layer PDL may expose most of the surface of the first electrode AE that faces a capping layer ECL of the first electrode AE or the encapsulating substrate.

The pixel defining layer PDL may include an organic insulating material. For example, the pixel defining layer PDL may be made of at least one of polystyrene, polymethylmethacrylate (PMMA), polyacrylonitrile (PAN), polyamide (PA), polyimide (PI), polyarylether (PAE), heterocyclic polymer, parylene, epoxy, benzocyclobutene (BCB), siloxane based resin and silane based resin.

The light emitting layer EML may be provided on the exposed surface of the first electrode AE. The light emitting layer EML may have a multilayer thin film structure including at least a light generation layer. For example, the light emitting layer EML may have a hole injection layer HIL that injects holes, a hole transport layer HTL that has an excellent hole transporting property that suppresses the movement of electrons that have failed to be combined in the light generation layer to increase the opportunity for holes and electron to be recombined. The light emitting layer EML further includes the light generation layer, which emits light by the recombination of the injected electron and hole, a hole blocking layer HBL for inhibiting the movement of the holes that are not combined in the light generation layer, an electron transport layer ETL for smoothly transporting electrons to the light generation layer, and an electron injection layer EIL for injecting electrons.

The color of the light generated in the light generation layer may be, for example, one of red, green, blue and white. For example, the color of the light generated in the light generation layer of the light emitting layer EML may be one of magenta, cyan and yellow.

The hole injection layer HIL, the hole transport layer HTL, the hole blocking layer HBL, the electron transport layer ETL and the electron injection layer EIL may be in a form of a common film connected in adjacent pixel regions.

The second electrode CE may be provided on the light emitting layer EML. The second electrode CE may be a transflective film. For example, the second electrode CE may be a thin metal layer that is thin enough to transmit light. The second electrode CE may transmit a portion of the light generated in the light generation layer and may reflect the remainder of the light generated in the light generation layer.

The second electrode CE may include a material having a lower work function than the transparent conductive film. For example, the second electrode CE may be made of at least one of molybdenum (Mo), tungsten (W), silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca) and alloys thereof.

A portion of the light emitted from the light emitting layer EML may not pass through the second electrode CE, and the light reflected from the second electrode CE may be reflected again in the reflective film. For example, the light emitted from the light emitting layer EML may resonate between the reflective film and the second electrode CE. The light extraction efficiency of the display element OLED may be improved by the resonance of the light.

The distance between the reflective film and the second electrode CE may vary depending on the color of the light generated in the light generation layer. For example, the distance between the reflective film and the second electrode CE may be adjusted to match the resonance distance, depending on the color of the light generated in the light generation layer.

A capping layer ECL may be provided on the second electrode CE. The capping layer ECL may cover the display element OLED and may prevent oxygen and moisture from penetrating into the display element OLED. The surface exposed to the outside of the capping layer ECL, i.e., the outer surface of the capping layer ECL, may be referred to as a first surface.

The capping layer ECL may include a plurality of insulating films. For example, the capping layer ECL may include at least one of inorganic films and at least one of organic films. For example, the capping layer ECL may include a first inorganic film on the second electrode CE, an organic film on the first inorganic film, and a second inorganic film on the organic film. The inorganic film may include at least one of silicon oxide, silicon nitride, silicon oxynitride, aluminum oxide, titanium oxide, zirconium oxide and tin oxide. The organic film may include one of acryl, polyimide (PI), polyamide (PA) and benzocyclobutene (BCB).

The capping layer ECL may isolate the display element OLED from the external environment. In some implementations, an encapsulation substrate may be applied instead of the capping layer ECL. The encapsulation substrate may be bonded to the base substrate SUB through a sealant. When the encapsulation substrate is used to isolate the display element OLED from the external environment, the capping layer ECL may be omitted.

FIGS. 2A to 2G illustrate cross-sectional views of steps of a method for fabricating a thin film transistor substrate according to an embodiment.

Figure 2A:
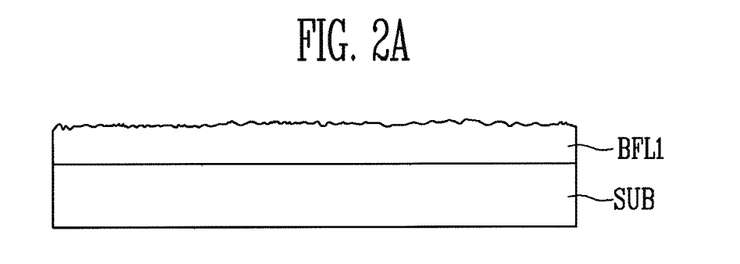
FIGS. 2A to 2G illustrate cross-sectional views of stages of a method for fabricating a thin film transistor substrate according to an embodiment.

Referring to FIG. 2A, the first buffer layer BFL1 of the buffer layer BFL may be laminated onto the base substrate SUB.

The base substrate SUB may be a flexible substrate, for example, a plastic substrate or may be a hard substrate.

The first buffer layer BFL1 may be formed by depositing an inorganic insulating material such as silicon oxide ($SiO_x$) on the base substrate SUB using a deposition method such as PECVD (Plasma Enhanced Chemical Vapor Deposition).

The first buffer layer BFL1 may have an uneven surface. For example, the surface of the first buffer layer BFL1 may have irregularities.

If the semiconductor layer SCL were to be formed on the first buffer layer as is, the curvature of the surface of the inorganic film constituting the buffer layer BFL could affect the semiconductor layer SCL to be formed thereon during subsequent processes. As a result, defects could be generated inside the silicon particles. Temporal afterimage, hysteresis of the thin film transistor, and other undesirable effects could result, thereby reducing the reliability of the thin film transistor.

Figure 2B:
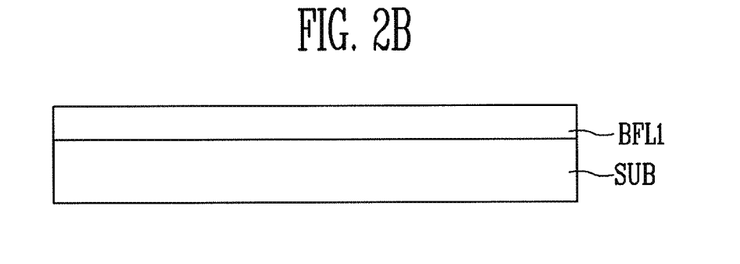

Referring to FIG. 2B, the surface of the first buffer layer BFL1 may be planarized. The planarization of the first buffer layer BFL1 may include treating the surface of the first buffer layer BFL1 using a chemical mechanical polishing/planarization (CMP) method in which chemical and mechanical processing are mixed. For example, the first buffer layer BFL1 may be polished chemically and/or mechanically by polishing pads that are mounted on the head portion of a CMP apparatus and rotate in contact with the surface of the first buffer layer BFL1 and by slurry flowing between the polishing pads and the first buffer layer BFL1. Accordingly, the surface of the first buffer layer BFL1 may be flattened by removing the irregularities thereon.

The surface of the first buffer layer BFL1 may be planarized by using the CMP method. In some implementations, the surface of the first buffer layer BFL1 may be planarized using other methods.

Figure 2C:
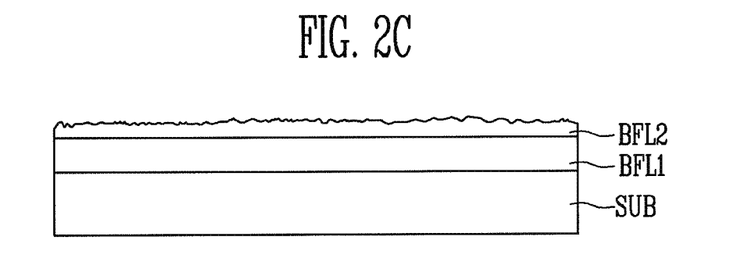
Figure 2D:
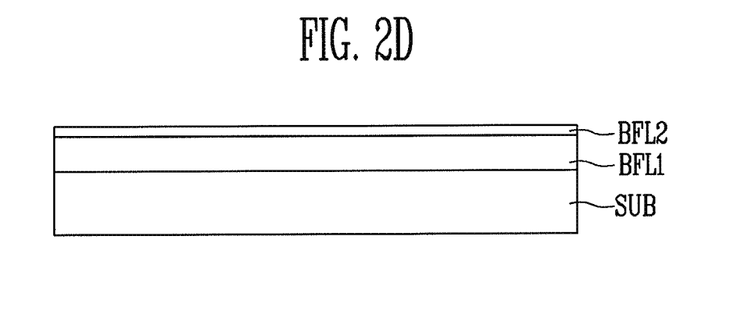

Referring to FIGS. 2C and 2D, the second buffer layer BFL2 may be laminated onto the first buffer layer BFL1 of the buffer layer BFL. A surface of the second buffer layer BFL2 may be planarized by a CMP method.

The second buffer layer BFL2 may be formed by depositing an inorganic insulating material such as silicon nitride ($SiN_x$) onto the planarized first buffer layer BFL1 using a deposition method such as PECVD, in the similar manner as described with respect to FIG. 2A. The second buffer layer BFL2 may have an uneven surface.

The surface of the second buffer layer BFL2 may be planarized by treating the surface of the second buffer layer BFL2 by a CMP method, in a similar manner as described above with respect to FIG. 2B.

Figure 2E:
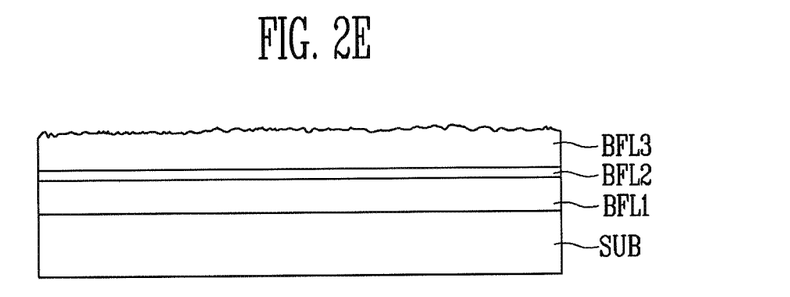
Figure 2F:
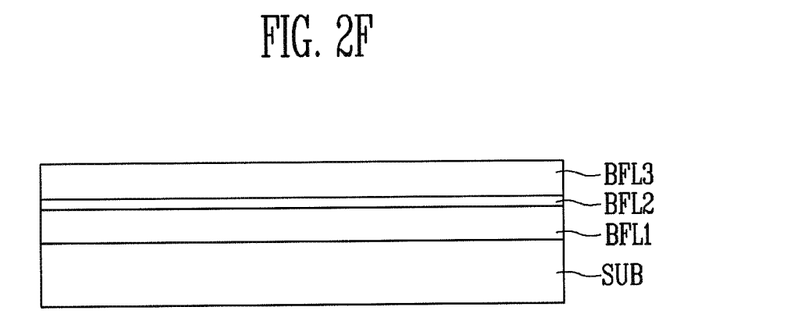

Referring to FIGS. 2E and 2F, the third buffer layer BFL3 may be laminated on the second buffer layer BFL2 of the buffer layer BFL, and a surface of the third buffer layer BFL3 is may be planarized by CMP method.

The third buffer layer BFL3 may be formed by depositing an inorganic insulating material such as silicon oxide ($SiO_x$) on the planarized second buffer layer BFL2 using a deposition method such as PECVD, in the similar manner as described with respect to FIG. 2A. The third buffer layer BFL3 may also have an uneven surface due to the low density of the silicon oxide.

The surface of the third buffer layer BFL3 may be planarized by treating the surface of the third buffer layer BFL3 by a CMP method, in a similar manner as described with respect to FIG. 2B.

In this embodiment, the planarization of the first, second, and third buffer layers BFL1, BFL2, and BFL3 may be conducted by the CMP method, as an example.

As examples, the CMP method may be performed only in the first buffer layer BFL1, or may be performed in the third buffer layer BFL3 alone. In some implementations, the CMP method may be performed in the first and second buffer layers BFL1 and BFL2, and may not be performed in the third buffer layer BFL3.

Figure 2G:
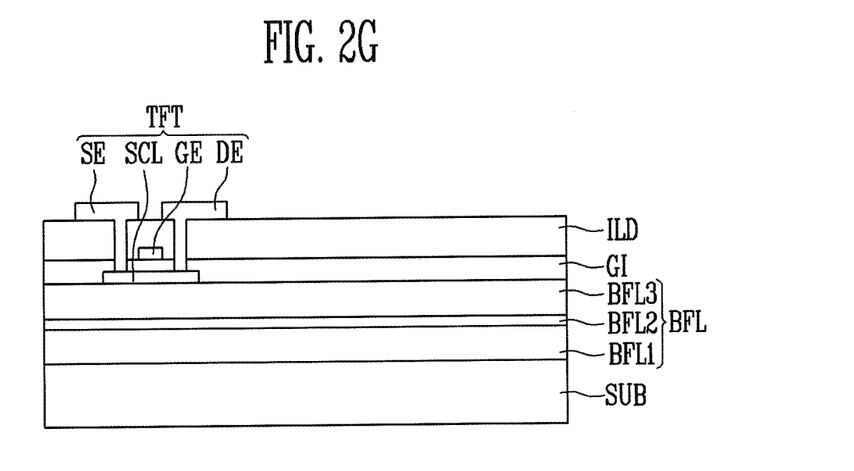

Referring to FIG. 2G, the semiconductor layer SCL may be formed on the buffer layer BFL. For example, the semiconductor layer SCL may be formed on the third buffer layer BFL3, which may be the uppermost layer of the buffer layer BFL.

The semiconductor layer SCL may include one of amorphous Si, polycrystalline Si, an oxide semiconductor and an organic semiconductor.

When the semiconductor layer SCL includes polycrystalline Si, the semiconductor layer SCL may be formed as follows.

A polysilicon film may be formed by forming a film including amorphous silicon on the third buffer layer BFL3, and irradiating laser light to the amorphous silicon to crystallize the amorphous silicon. The semiconductor layer SCL may be formed by patterning the film including polysilicon.

The gate insulating film GI may be formed to cover the semiconductor layer SCL. The gate insulating film GI may include at least one of silicon oxide and silicon nitride.

The gate electrode GE may be formed by forming a film including a conductive material on the gate insulating film GI, and patterning the film. The gate electrode GE may overlap with at least a portion of the semiconductor layer SCL.

After the gate electrode GE is formed, impurities may be doped or injected into the semiconductor layer SCL using the gate electrode GE as a mask. The region of the semiconductor layer SCL in which the impurities are doped or injected may have conductivity. The region of the semiconductor layer SCL in which the impurity is doped or injected may not overlap with the gate electrode GE. The region of the semiconductor layer SCL in which the impurity is doped or injected may be divided into two regions by the region overlapping the gate electrode GE interposed therebetween. One of the two regions may be a source region and the other may be a drain region. The region between the source region and the drain region may be a channel region.

The interlayer insulating film ILD, may be formed to cover the gate electrode GE. The interlayer insulating film ILD may include at least one of silicon oxide and silicon nitride.

A contact hole may be formed by patterning the gate insulating film GI and the interlayer insulating film ILD to expose a part of each of the source region and the drain region of the semiconductor layer SCL.

The source electrode SE connected to the source region and the drain electrode DE connected to the drain region may be formed by forming a film including a conductive material and patterning the film.

A thin film transistor of a top gate structure may be fabricated by a method of fabricating a thin film transistor substrate In some implementations, a thin film transistor of a bottom gate structure may be formed by first forming the gate electrode GE on the third buffer layer BFL3 and then forming the semiconductor layer SCL, the source electrode SE and a drain electrode DE.

Figure 3A:
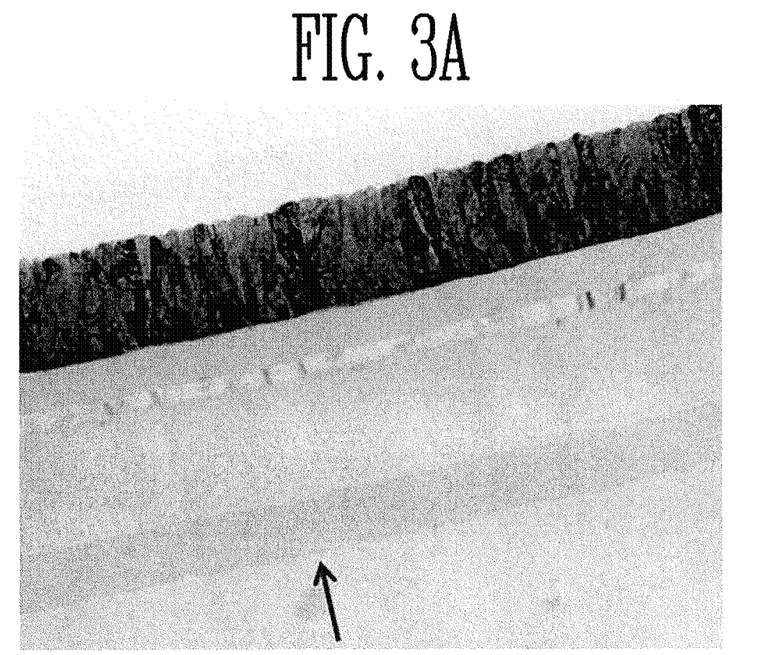
FIGS. 3A and 3B illustrate TEM images of a cross-section of a thin film transistor substrate of a Comparative example (3A) in which a CMP method was not performed and a cross-section of a thin film transistor substrate of an Inventive example (3B) in which the CMP method was performed according to an embodiment.
Figure 3B:
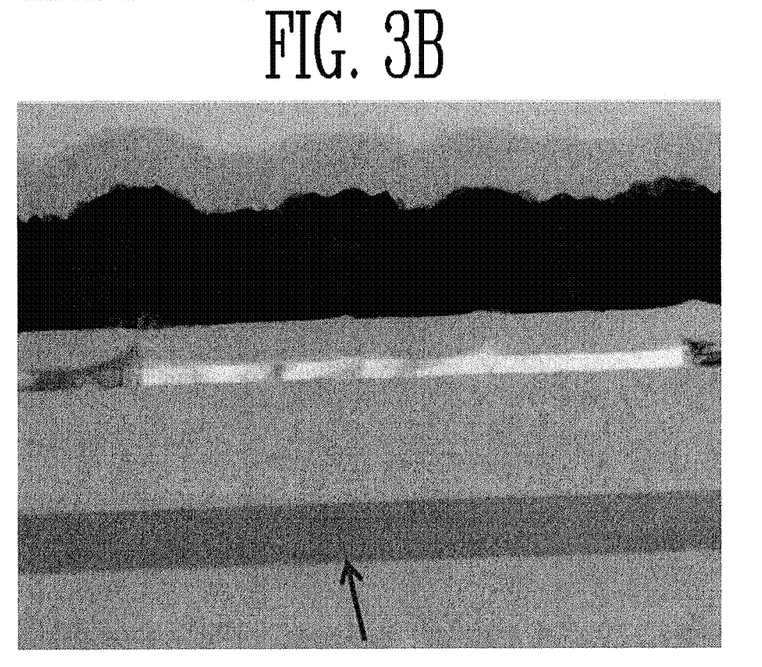
Figure 4:
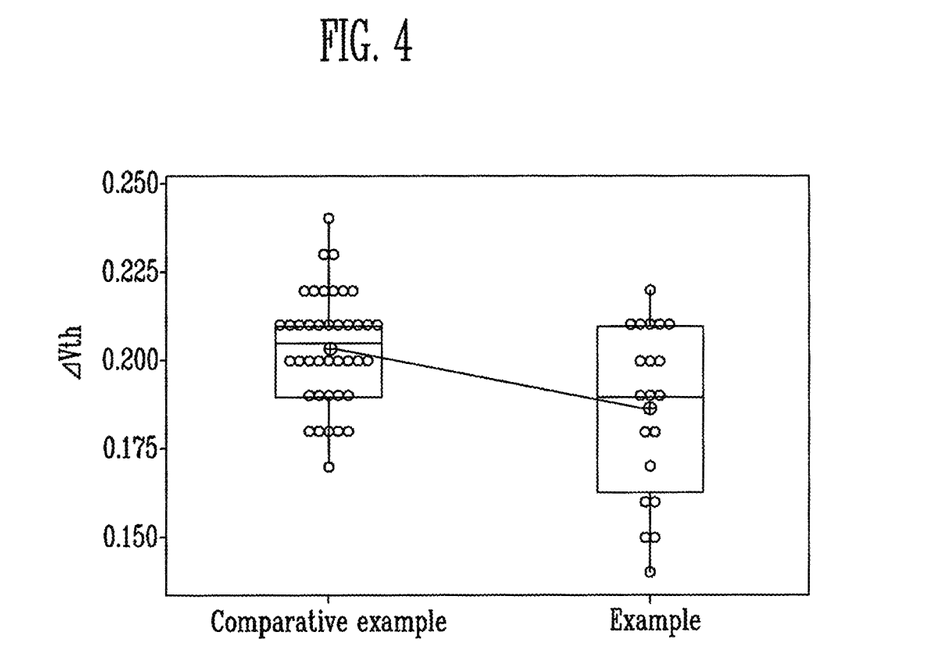
FIG. 4 illustrates a graph showing the characteristics of a thin film transistor included in a thin film transistor substrate according to an embodiment.

FIGS. 3A and 3B illustrate TEM images of a cross-section of a thin film transistor substrate of a Comparative example (3A) in which the CMP method was not performed and an Inventive example (3B) in which the CMP method was performed according to an embodiment. FIG. 4 illustrates a graph showing the characteristics of a thin film transistor included in a thin film transistor substrate according to an embodiment.

Referring to FIGS. 3A and 3B, as shown in the cross-sectional views of the thin film transistor substrate which are laminated in the triple-layered structure, the surface of the conventional third buffer layer of the thin film transistor substrate, which is not planarized, may have unevenness (Comparative example, 3A). In contrast, the surface of the third buffer layer of the thin film transistor substrate according to an embodiment, on which the planarization of the third buffer layer is conducted, shows the flat surface of the third buffer layer without irregularities (Inventive example, 3B).

Referring to FIG. 4, in order to confirm characteristics of the thin film transistor provided on the buffer layer, the change ($\Delta V_{th}$) of the threshold voltage of the thin film transistor was measured. As a result, the value of $\Delta V_{th}$ of the Inventive example was reduced to 0.1865, as compared with the value of $\Delta V_{th}$ of the Comparative example, which was 0.2038. Accordingly, it may be confirmed that the characteristics of the thin film transistor were improved in the Inventive example, as compared to the Comparative example.

By way of summation and review, embodiments provide a method of fabricating a thin film transistor substrate that improves the reliability of the thin film transistor. By planarizing at least one film of the buffer layer by using the method for fabricating thin film transistor substrate according to embodiments, the reliability of the thin film transistor can be improved.

What is claimed is:

1. A method for fabricating a thin film transistor substrate, the method comprising:
    forming a buffer layer including at least one film on a base substrate;
    planarizing a surface of the buffer layer; and
    forming a thin film transistor on the buffer layer.

2. The method as claimed in claim 1, wherein planarizing the surface of the buffer layer is performed by chemical mechanical polishing.

3. The method as claimed in claim 1, wherein the buffer layer includes a first buffer layer provided on the base substrate, and a second buffer layer provided on the first buffer layer.

4. The method as claimed in claim 3, further including planarizing a surface of the first buffer layer.

5. The method as claimed in claim 3, wherein:
    the first buffer layer includes silicon oxide, and
    the second buffer layer includes silicon nitride.

6. The method as claimed in claim 4, wherein the buffer layer further includes a third buffer layer provided on the second buffer layer.

7. The method as claimed in claim 6, further comprising planarizing a surface of the second buffer layer.

8. The method as claimed in claim 6, wherein the third buffer layer includes silicon oxide.

9. The method as claimed in claim 1, wherein the thin film transistor includes:
    a semiconductor layer on the buffer layer;
    a gate electrode overlapping the semiconductor layer with a gate insulating film interposed therebetween; and
    a source electrode and a drain electrode connected to the semiconductor layer and spaced apart from the each other.

10. The method as claimed in claim 1, wherein a semiconductor layer of the thin film transistor is in direct contact with the buffer layer.

11. The method as claimed in claim 1, wherein a semiconductor layer of the thin film transistor is in direct contact with a planarized surface of the buffer layer.

12. A method for fabricating a thin film transistor substrate, the method comprising:
    forming a first inorganic film of a buffer layer directly on a substrate;
    planarizing a top surface of first inorganic film; and
    forming a thin film transistor directly on the buffer layer, the thin film transistor including a semiconductor layer directly on the buffer layer, a gate electrode overlapping the semiconductor layer with a gate insulating film interposed therebetween, and a source electrode and a drain electrode connected to the semiconductor layer and spaced apart from the each other.

13. The method as claimed in claim 12, wherein the semiconductor layer is in direct contact with a planarized surface of the buffer layer.

14. The method as claimed in claim 12, further comprising:
    forming a second inorganic film of the buffer layer directly on the first inorganic film before forming the thin film transistor; and
    planarizing a top surface of second inorganic film.

15. The method as claimed in claim 14, wherein:
    the first buffer layer includes silicon oxide, and
    the second buffer layer includes silicon nitride.

16. The method as claimed in claim 14, further comprising:
    forming a third inorganic film of the buffer layer directly on the second inorganic film before forming the thin film transistor; and
    planarizing a top surface of third inorganic film.

17. The method as claimed in claim 16, wherein:
    the first buffer layer includes silicon oxide,
    the second buffer layer includes silicon nitride, and
    the third buffer layer includes silicon oxide.

18. The method as claimed in claim 16, wherein the semiconductor layer is in direct contact with a planarized surface of the buffer layer.

* * * * *